United States Patent [19]
Lee et al.

[11] Patent Number: 6,005,825
[45] Date of Patent: Dec. 21, 1999

[54] SYNCHRONOUS SEMICONDUCTOR MEMORY DEVICE HAVING WAVE PIPELINING CONTROL STRUCTURE AND METHOD FOR OUTPUTTING DATA USING THE SAME

[75] Inventors: Kyu-chan Lee, Seoul; Nam-jong Kim, Suwon, both of Rep. of Korea

[73] Assignee: Samsung Electronics Co., Ltd., Suwon, Rep. of Korea

[21] Appl. No.: 09/178,734

[22] Filed: Oct. 27, 1998

[30] Foreign Application Priority Data

Dec. 4, 1997 [KR] Rep. of Korea ........................ 97-65907

[51] Int. Cl.[6] ........................................................ G11C 7/00
[52] U.S. Cl. .......................... 365/233; 365/233.5; 365/194
[58] Field of Search ..................................... 365/233, 194, 365/233.5, 239, 221

[56] References Cited

U.S. PATENT DOCUMENTS 5,402,389  3/1995  Flannagan et al. ...................... 365/233
5,581,512  12/1996  Kitamura ................................. 365/233
5,822,254  10/1998  Koshikawa et al. ..................... 365/233

OTHER PUBLICATIONS

1996 Symposium on VlSI Circuits Digest of Technical Paper, pp. 192–193, "Skew Minimization Techniques for 256M–bit Synchronous DRAM and Beyond" Jin–Man Han, et al.
1995 ISSCC Digest of Technical Papaers, pp. 250–251, by Hoi–Jun Yoo, et al.
IEEE Journal of Solid–State Circuits, vol. 31, No. 11, Nov. 1996, pp. 1656–1665, by Takanori Saeki, et al.

*Primary Examiner*—Vu A. Le
*Attorney, Agent, or Firm*—Howrey & Simon

[57] ABSTRACT

A synchronous semiconductor memory device having a wave pipelining control structure and a method of outputting data therefrom. A register for storing the data output from a memory cell is controlled by a control signal in response to first and second external clock signals. The level transition of the control signal derived from the first clock is delayed, so that data output malfunctioning is prevented even though manufacturing process conditions are changed.

16 Claims, 7 Drawing Sheets

SYNCHRONOUS SEMICONDUCTOR MEMORY DEVICE HAVING WAVE PIPELINING CONTROL STRUCTURE AND METHOD FOR OUTPUTTING DATA USING THE SAME

BACKGROUND OF THE INVENTION

1. Field of the Invention

The present invention relates to a semiconductor memory device, and more particularly, to a synchronous semiconductor memory device having a wave pipelining control structure, and a method for outputting data using the same.

2. Description of the Related Art

In general, a synchronous semiconductor memory device differs from a conventional memory device in that data input and output operations are performed in synchronization with a memory system clock. In the synchronous semiconductor memory device, all input and output operations are normally synchronized with a rising edge of an external clock signal. Such operation reduces memory access time and allows a system designer to design a simple interface.

A conventional memory device performs a sensing operation after selecting a word line. It is impossible to select another word line during a precharge operation for the selected word line. However, a synchronous semiconductor memory device includes two or more memory array banks each having a separate row control circuit. There is no limitation as in the conventional DRAM between word lines located in different memory array banks. Word lines in different banks can be continuously accessed, thereby increasing the amount of accessible data and the speed of data access as compared with the conventional DRAM.

The synchronous semiconductor memory device is characterized by a "read latency" which represents the delay time until the first data is output. After the read latency, data is read out according to an internal data access clock, and is not dependent on a critical path within the memory device.

Generally, the synchronous semiconductor memory device adopts a multi-stage pipelining control structure as its data output structure. The multi-stage pipelining control structure includes data latches along a data path from the memory cell to a data output pad, and a transmission gate-type switch between latches. The switch is synchronized with a clock, and controlled by pulse signals.

However, the multi-stage pipelining control structure requires more data latching steps as a clock frequency increases and as the number of latching steps increases, the read latency increases.

A wave pipelining control structure is a data output control structure that minimizes such increase in read latency. In the wave pipelining control structure, a plurality of parallel latches are controlled by a control signal which is delayed in synchronization with a clock signal. The wave pipelining control structure does not increase the read latency even if the frequency of the clock signal increases.

FIG. 1 is a block diagram of a semiconductor memory device having a conventional wave pipelining control structure. During a read operation, data is read from a cell designated by an external address via a bit line BL and an input/output (I/O) line. The read data is amplified by a sense amplifier 101. A controller 103 detects a rising edge of an external clock signal to generate a control signal ODL0. A register 105 stores the signal amplified by the sense amplifier 101 under the control of the control signal ODL0.

According to the conventional wave pipelining control structure, a control signal ODL0 that controls the data of the first clock prevents the data from being stored in the register 105 and the control signal ODL0 is controlled by the controller 103 to delay only the first clock signal by a predetermined time.

However, the above-described conventional wave pipelining control structure suffers the following drawbacks. As the integration density of the memory device increases, the data output rate from a memory cell region becomes more sensitive to variations resulting from the manufacturing process. However, the data control signal ODL0 is generated in a periphery circuit portion such that its sensitivity to any fluctuations in manufacturing process conditions becomes relatively small. When implementing the conventional wave pipelining control structure, the control signal ODL0 is delayed by a predetermined time. If delay occurs on a data path due to variations resulting from the manufacturing process, the memory device malfunctions because before the accessed data reaches the register 105 on the data path, level transition of the control signal may occur, and block the input. In this case, even though the memory device is operating at a low frequency, since the control signal derived from the first clock is delayed by a predetermined time, the malfunction of the memory device persists.

SUMMARY OF THE INVENTION

To solve the above problems, it is an object of the present invention to provide a synchronous semiconductor memory device having a data output structure capable of preventing malfunction of a memory device regardless of fluctuations in manufacturing process conditions, and a method of outputting data therefrom.

According to one embodiment of the present invention, there is provided a synchronous semiconductor memory device having a structure in which data are continuously output during one cycle of a reading mode. The synchronous semiconductor memory device includes a register for storing data output from a cell array in response to a control signal, and a control unit for generating the control signal in response to first and second external clock signals. The control signal is transitioned in response to either an auxiliary signal which is transitioned by detecting the rising edge of the first external clock signal or a preliminary signal which is transitioned by detecting the rising edge of the second external clock signal, whichever changes the state later.

According to another embodiment of the present invention, there is provided a data output method of a synchronous semiconductor memory device, for continuously outputting data during one cycle of a reading mode. Data is output from a cell array in response to a control signal and stored. The control signal is generated in response to first and second external clock signals and is transitioned in response to either an auxiliary signal which is transitioned by detecting the rising edge of the first external clock signal or a preliminary signal which is transitioned by detecting the rising edge of the second external clock signal, whichever changes later.

BRIEF DESCRIPTION OF THE DRAWINGS

The above object and advantages of the present invention will become more apparent through a detailed description thereof with reference to the attached drawings in which.

DESCRIPTION OF THE PREFERRED EMBODIMENT

Figure 1:
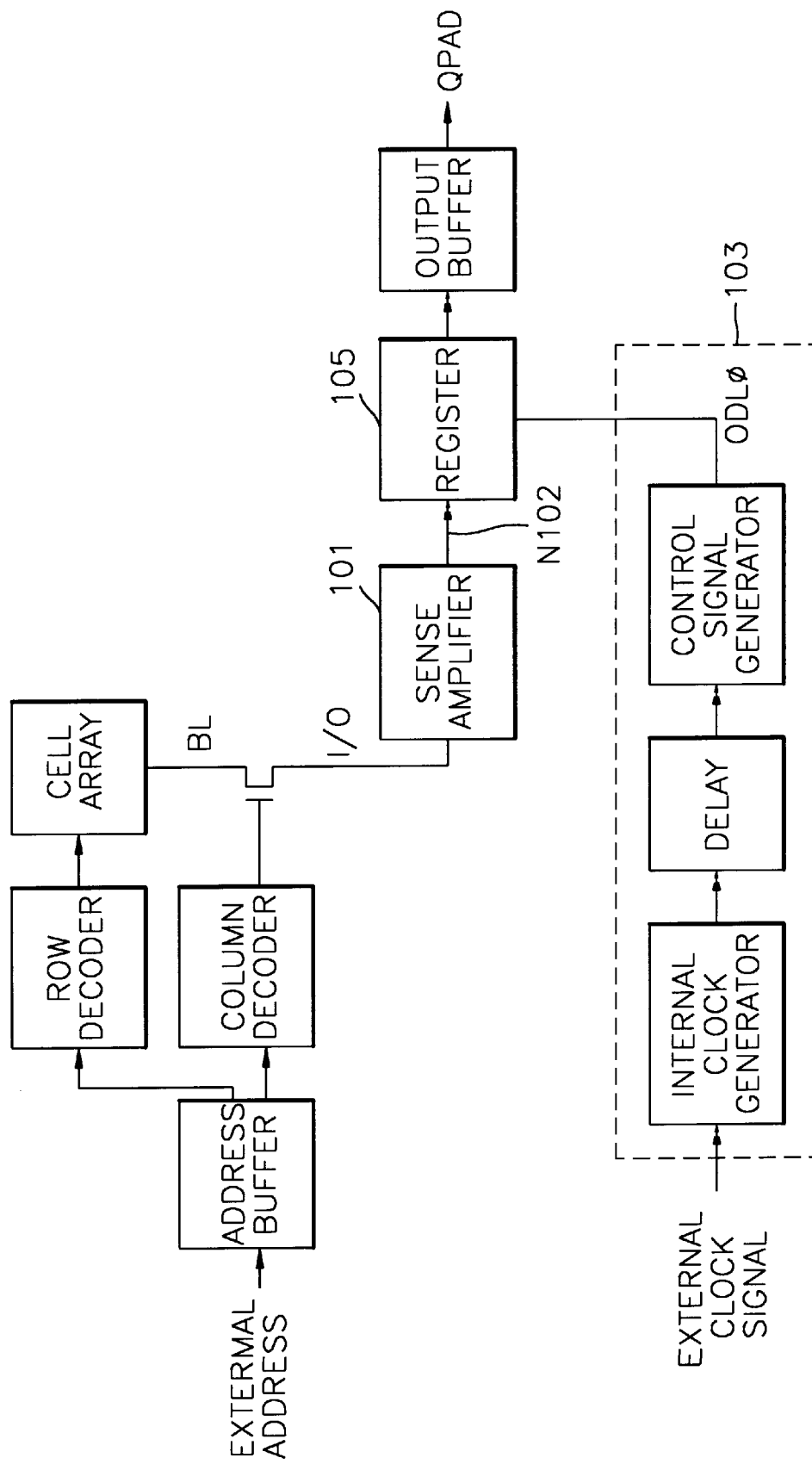
FIG. 1 is a block diagram of a semiconductor memory device having a conventional wave pipelining control structure.
Figure 2:
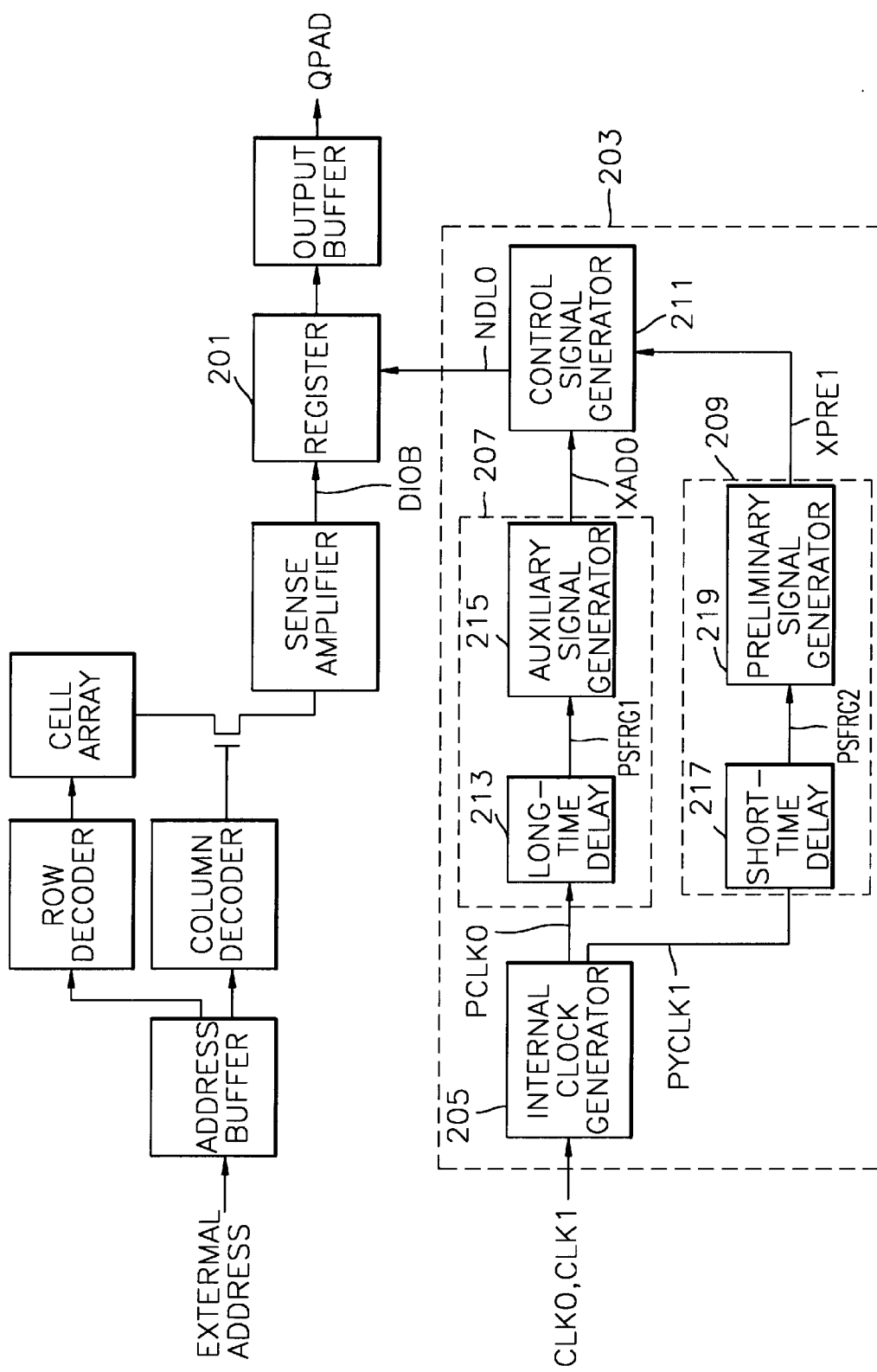
FIG. 2 is a block diagram of a semiconductor memory device having a wave pipelining control structure according to a preferred embodiment of the present invention.

FIG. 2 illustrates a semiconductor memory device having a wave pipelining control structure, in which data are continuously output during one cycle of reading mode, including a register 201 and a control unit 203.

The register 201 stores data DIOB output from a memory cell in response to a control signal NDL0. The control unit 203 generates the control signal NDL0 in response to a first external clock signal CLK0 and a second external clock signal CLK1.

The level of the control signal NDL0 transitions in response to the later transitioning of an auxiliary signal XAD or a preliminary signal XPRE. The level of the auxiliary signal XAD transitions by detecting the rising edge of the first external clock signal CLK0. The level of the preliminary signal XPRE transitions by detecting the rising edge of the second external clock signal CLK1.

The control unit 203 includes an internal clock signal generator 205, an auxiliary signal delay and generator 207, a preliminary signal delay and generator 209, and a control signal generator 211.

The internal clock signal generator 205 generates a first internal clock signal PCLK0 and a second internal clock signal PCLK1. The first internal clock signal PCLK0 is generated by detecting the rising edge of the first external clock signal CLK0, and the second internal clock signal PCLK1 is generated by detecting the rising edge of the second external clock signal CLK1.

The auxiliary signal delay and generator 207 delays the first internal clock signal PCLK0, and the level of its output signal, i.e., an auxiliary signal XAD0, transitions in response to the activation of the first internal clock signal PCLK0. Also, the preliminary signal delay and generator 209 delays the second internal clock signal PCLK1 by a predetermined time which is shorter than the delay time of the auxiliary signal delay and generator 207, and the level of its output signal, i.e., a preliminary signal XPRE1, transitions in response to the activation of the second internal clock signal PCLK1. In the preferred embodiment, the delay time of the preliminary signal delay and generator 209 is a half of that of the auxiliary signal delay and generator 207.

The control signal generator 211 receives the auxiliary signal XAD0 and the preliminary signal XPRE1, and the level of the control signal NDL0 transitions in response to the later transitioning auxiliary signal XAD0 or preliminary signal XPRE1.

The auxiliary signal delay and generator 207 includes a long-time delay 213 and an auxiliary signal generator 215. The long-time delay 213 delays the first internal clock signal PCLK0 to generate a long-time delay clock signal PSFRG1. The auxiliary signal generator 215 transitions the level of the auxiliary signal XAD0 in response to the activation of the long-time delay clock signal PSFRG1 and outputs the transitioned auxiliary signal.

Figure 3:
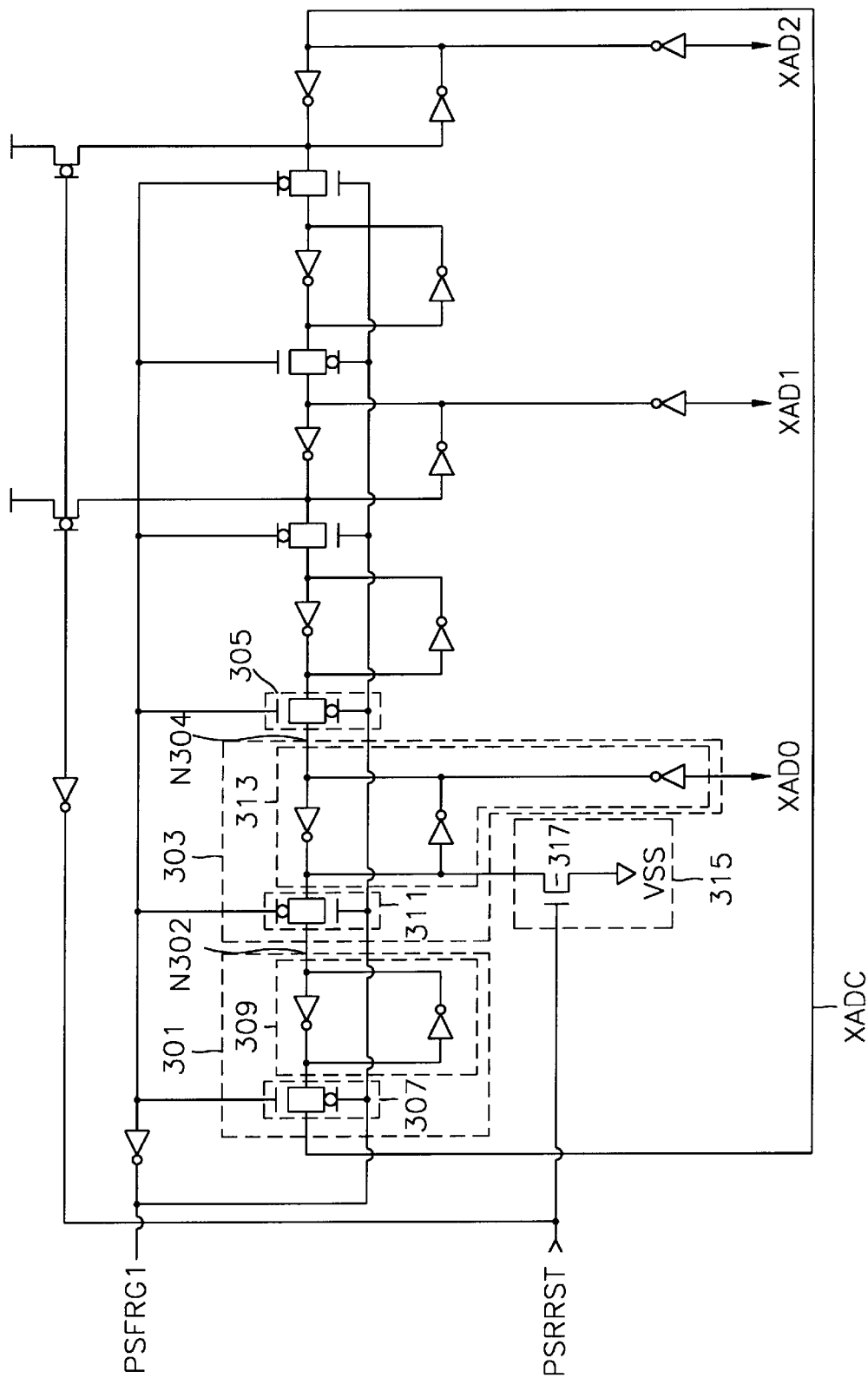
FIG. 3 is a diagram showing the auxiliary signal generator of FIG. 2.

FIG. 3 is a diagram showing the auxiliary signal generator 215 of FIG. 2. The auxiliary signal generator 215 includes a first transmission latch gate 301, a second transmission latch gate 303, and a transmission gate 305. The first transmission latch gate 301 transmits an auxiliary circulation signal XADC and latches the transmitted signal when the long-time delay signal PSFRG1 is inactive. That is, when the long-time delay signal PSFRG1 goes to logic low, the transmission gate 307 turns on to transmit the auxiliary circulation signal XADC. A latch 309 latches the signal transmitted by the transmission gate 307.

The second transmission latch gate 303 transmits the signal at an output node N302 of the first transmission latch gate 301 and latches the transmitted signal when the long-time delay signal PSFRG1 is active, to generate the auxiliary signal XAD0. That is, when the long-time delay signal PSFRG1 goes to logic high, a transmission gate 311 turns on to transmit the signal of the output node N302 of the first transmission latch gate 301. The latch 313 latches the signal transmitted by the transmission gate 311.

The transmission gate 305 transmits the signal of an output node N304 of the second transmission latch gate 303 when the long-time delay signal PSFRG1 is inactive, to generate the auxiliary circulation signal XADC. That is, when the long-time delay signal PSFRG1 goes to logic low, the transmission gate 305 turns on to transmit the signal of the output node N304 of the second transmission latch gate 303. As a result, the auxiliary circulation signal XADC is generated.

Preferably, the auxiliary signal generator 215 further includes an initializing portion 315. The initializing portion 315 initializes the auxiliary signal XAD0 after a read operation is completed. In this embodiment, the initializing portion 315 is an NMOS transistor 317. The NMOS transistor 317 is controlled by an initialization signal PSRRST. The initialization signal PSRRST is in the form of a pulse when the burst operation is completed.

The operation of the auxiliary signal delay and generator 207 will now be described. When the previous burst is completed, the initialization signal generates a pulse by transitioning from a "low" state to a "high" state. Thus, the NMOS transistor 317 turns on and then turns off, and the auxiliary signal XAD0 goes to a high state. Here, the auxiliary circulation signal XADC goes to a "low" state. Because the long-time delay signal PSFRG1 is in the "low" state, the output signal N302 of the first transmission latch gate 301 is in the "high" state.

Subsequently, when the level of the long-time delay signal PSFRG1 is transitioned to a "high" by detecting the rising edge of the first external clock signal CLK0, the level of the auxiliary signal XAD is transitioned to a "low" state. The signals XAD1 and XAD2 are transitioned after the rising edges of the second and third external clock signals are detected and then delayed.

The operation of the preliminary signal delay and generator 209 of FIG. 2 will now be described. The preliminary signal delay and generator 209 includes a short-time delay 217 and a preliminary signal generator 219. The short-time delay 217 delays a second internal clock signal PCLK1 to generate a short-time delay clock signal PSFRG2. The delay time by the short-time delay 217 is shorter than that by the long-time delay 213, generally, half of the delay time of the long-time delay 213. The preliminary signal generator 219 outputs the auxiliary signal XPRE1 whose level is transitioned in response to the activation of the short-time delay clock signal PSFRG2.

Figure 4:
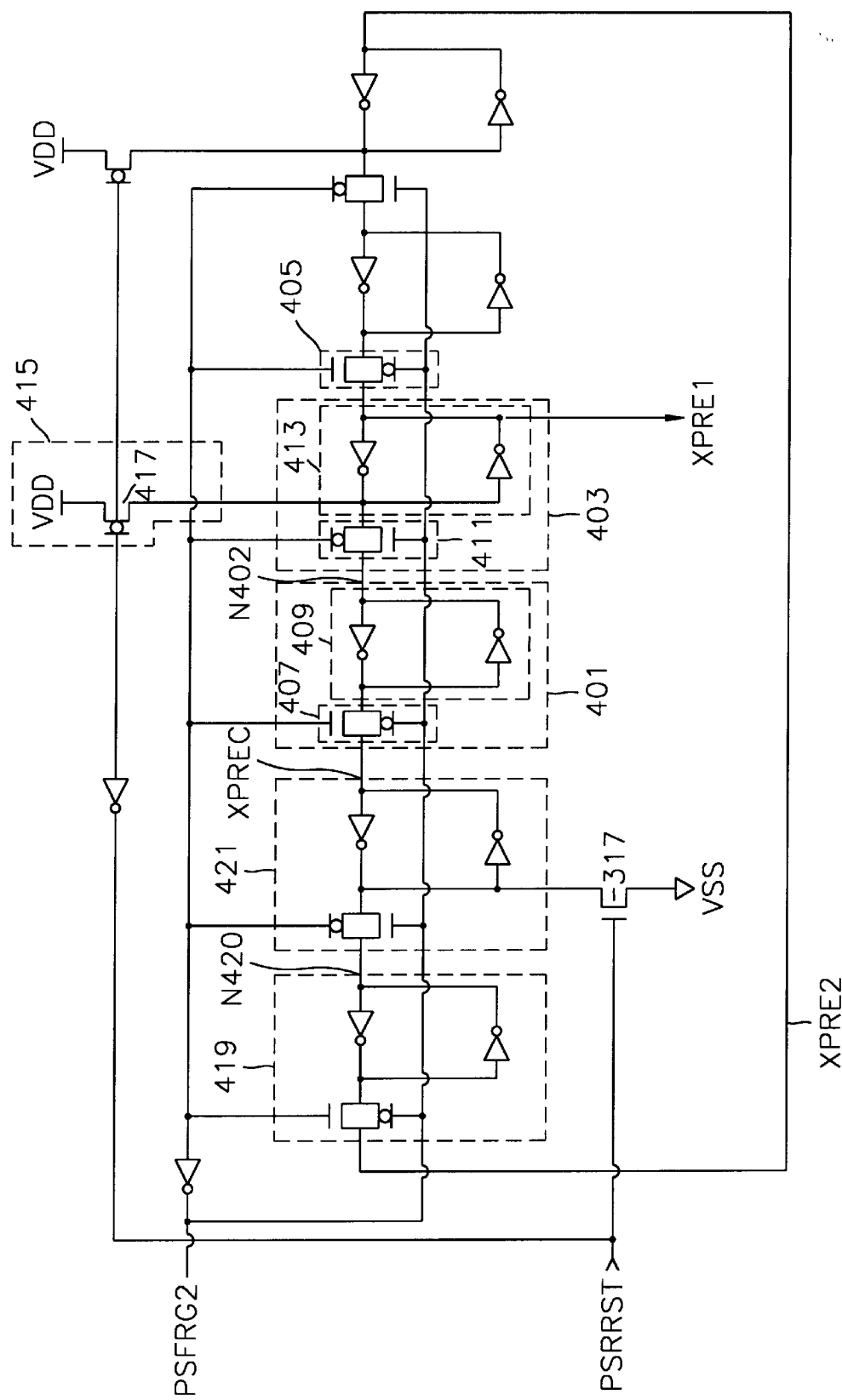
FIG. 4 is a diagram showing the preliminary signal generator of FIG. 2.

FIG. 4 is a diagram showing the preliminary signal generator 219 of FIG. 2. The preliminary signal generator 219 includes a first transmission latch gate 401, a second transmission latch gate 403 and a transmission gate 405. The first transmission latch gate 401 transmits the preliminary circulation signal XPREC and latches the transmitted signal when the short-time delay signal PSFRG2 becomes inactive. That is, when the short-time delay signal PSFRG2 is in a "low" state, a transmission gate 407 turns on to transmit the preliminary circulation signal XPREC. A latch 409 latches the signal transmitted by the transmission gate 407.

The second transmission latch gate 403 transmits the signal at the output node N402 of the first transmission latch gate 401 and latches the transmitted signal when the short-time delay signal PSFRG2 is active, to generate the preliminary signal XPRE1. That is, when the short-time delay signal PSFRG2 goes high, a transmission gate 411 turns on to transmit the signal of the output node N402 of the first transmission latch gate 401. A latch 413 latches the signal transmitted by the transmission gate 411.

The transmission gate 405 transmits the preliminary signal XPRE1, which is the output signal of the second transfer latch gate 403, when the short-time delay signal PSFRG2 is inactive, to generate the preliminary circulation signal XPREC. That is, when the short-time delay signal PSFRG2 goes to a "low" state, the transmission gate 405 turns on to transmit the preliminary signal XPRE1, thereby generating the auxiliary circulation signal XPREC.

The preliminary signal generator 219 further includes an initializing portion 415. The initializing portion 415 initializes the auxiliary signal XPREC after a read operation is completed. In this embodiment, the initializing portion 415 is a PMOS transistor 417. The PMOS transistor 417 is controlled by an initialization signal PSRRST. The initialization signal PSRRST is the signal generated as a pulse when the burst is completed.

The third transmission latch gate 419 transmits the signal XPRE2 and latches the transmitted signal when the short-time delay signal PSFRG2 is inactive. The fourth transmission latch gate 421 transmits the signal at the output node N420 of the third transmission latch gate 419 and latches the transmitted signal when the short-time delay signal PSFRG2 is active.

Next, the operation of the auxiliary signal delay and generator 209 will be described. When the previous burst is completed, the initialization signal generates a pulse from a "low" state to a "high" state. Thus, the PMOS transistor 417 turns on and then turns off, and the preliminary signal XPRE1 goes to a high state. Here, the preliminary circulation signal XPREC goes to a "low" state, and the signal XPRE2 goes to a "low" state. Because the short-time delay signal PSFRG2 is in the "low" state, the signal of the output node N420 of the third transmission latch gate 419 is in the "high" state, and the signal of the output node N402 of the first transmission latch gate 401 is in the "low" state.

Subsequently, when the level of the short-time delay signal PSFRG2 is transitioned to a "high" by detecting the rising edge of the first external clock signal CLK0, the level of the preliminary signal XPREC is transitioned to a "low" state. The level of the preliminary signal XPRE1 is transitioned to a "high" state. When the short-time delay signal PSFRG2 is transitioned to a "low" state, the signal at the output node N402 of the first transmission latch gate 401 is in the "high" state.

Then, when the short-time delay signal PSFRG2 is transitioned to a "high" by detecting the rising edge of the second external clock signal CLK1, the level of the preliminary signal XPRE1 is transitioned to a "low" state.

Figure 5:
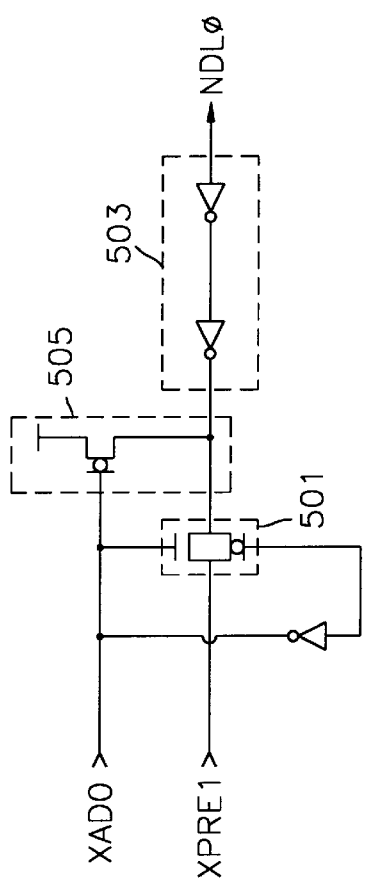
FIG. 5 is a diagram showing the control signal generator of FIG. 2.

FIG. 5 is a diagram showing the control signal generator 211 of FIG. 2.

The control signal generator 211 includes a transmission gate 501 and a buffer 503. The transmission gate 501 transmits the preliminary signal XPRE1 in response to the auxiliary signal XAD0. The buffer 503 buffers the signal transmitted by the transmission gate 501 to generate the control signal NDL0.

The control signal generator 211 of this embodiment further comprises an initializing portion 505. The initializing portion 505 initializes the control signal NDL0 when the auxiliary signal XAD0 is inactive.

Thus, when the control signal generator 211 of this embodiment is in an initial state, that is, when the auxiliary signal XAD0 is in a "low" state, the level of the control signal NDL0 becomes high. The control signal NDL0 changes state in response to either the auxiliary signal XAD0 or the preliminary signal XPRE1, whichever changes state later. That is, the level of the control signal NDL0 is transitioned after the level of the auxiliary signal XAD0 is transitioned from "low" to "high" state and the level of the preliminary signal XPRE1 is transitioned from "high" to "low" state.

The auxiliary signal XAD0 is generated by detecting the rising edge of the first external clock signal, and the preliminary signal XPRE1 is generated by detecting the rising edge of the second external clock signal. However, the level transition of the auxiliary signal XAD0 may occur later than the level transition of the preliminary signal XPRE1. The reason for this is that the delay by the short-time delay 215 is shorter than the delay by the long-time delay 213.

Figure 6:
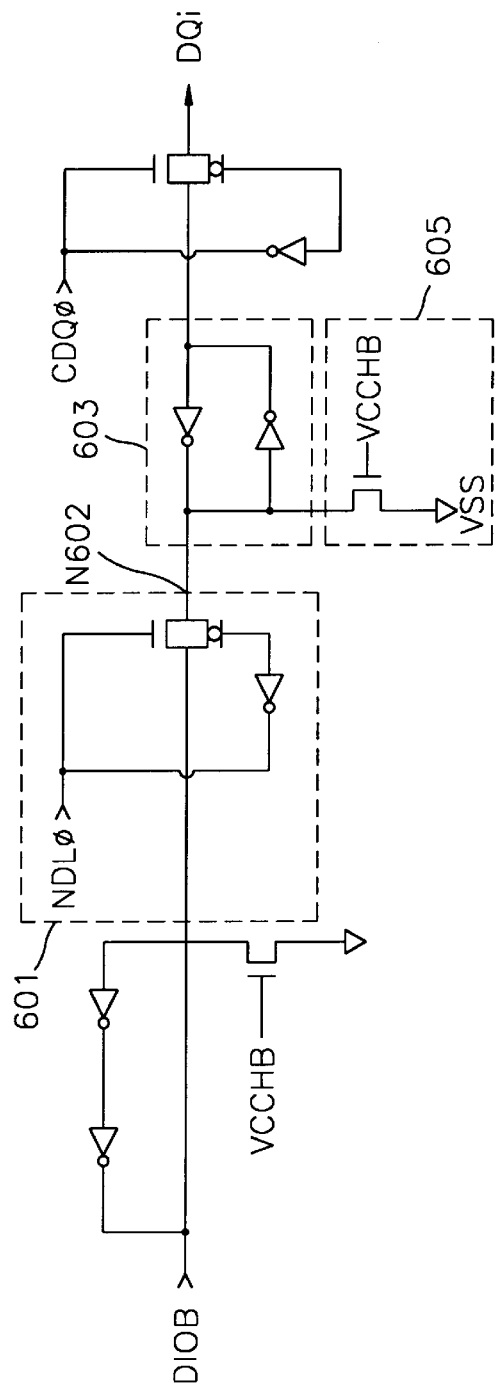
FIG. 6 is a diagram showing an example of the register of FIG. 2.

FIG. 6 is a diagram showing an example of the register 201 of FIG. 2. Referring to FIG. 6, the register 201 includes a transmission gate 601 and a latch 603. When the control signal NDL0 is active high, the transmission gate 601 transmits the output line data DIOB. When the control signal NDL0 is inactive low, the transmission gate turns off, so that the transmission of the output line data DIOB is blocked. The latch 603 latches the signal transmitted by the transmission gate 601.

The register 201 further includes an initializing portion 605. The initializing portion 605 is an NMOS transistor. The signal VCCHB is transitioned to "high" and then to "low". Thus, when the power is turned on, the signal of an output node N602 of the transmission gate 601 is initialized as a "low" level. The data latched by the latch 603 is output as the signal DQi when the signal CDQ0 is in a high state.

Figure 7:
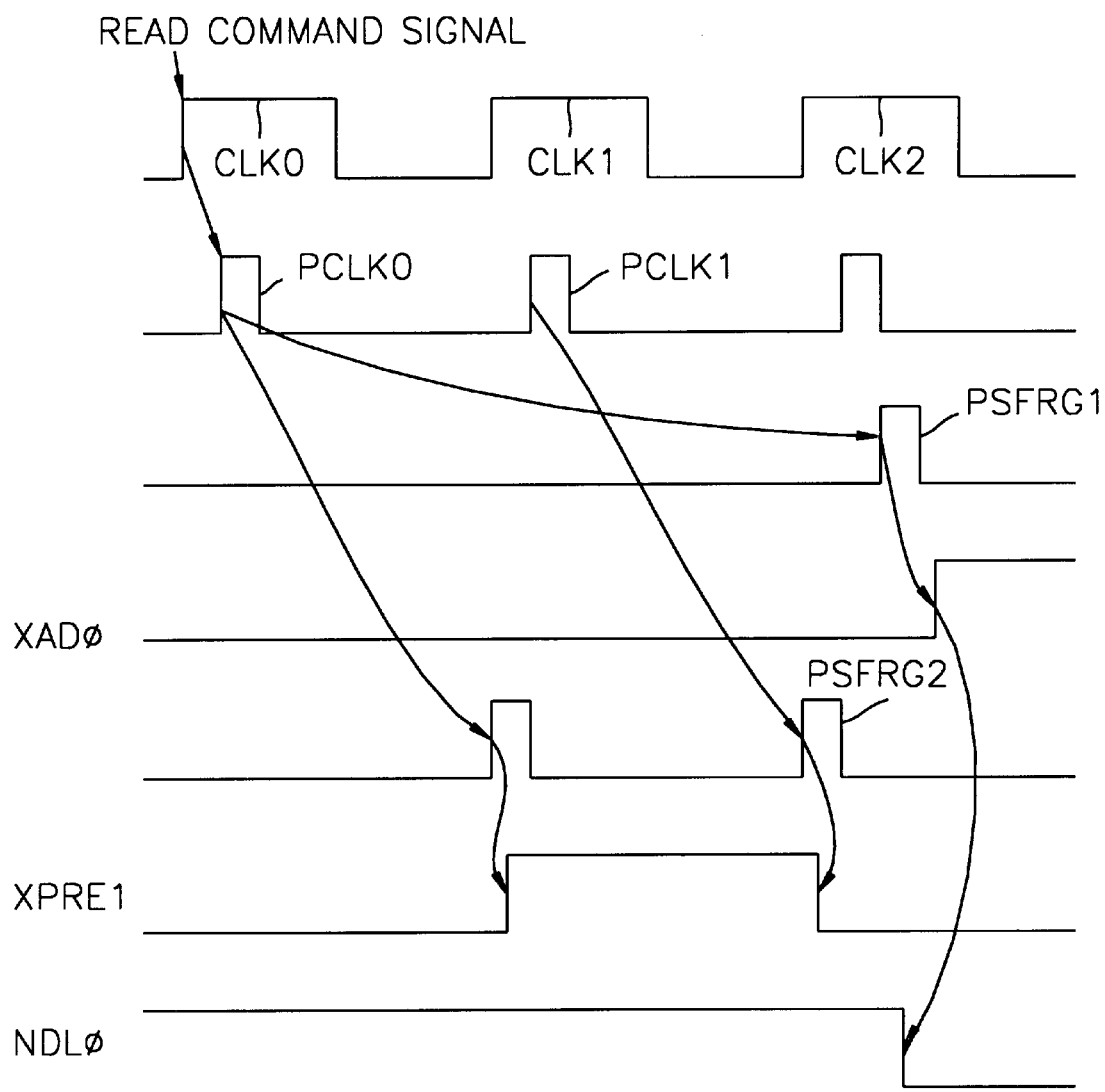
FIG. 7 is a timing diagram illustrating device operation at high frequency.

FIG. 7 is a timing diagram illustrating operation of the synchronous semiconductor memory device at high frequency. By detecting the rising edge of the first external clock signal CLK0, the first internal clock signal PCLK0 is generated. The second internal clock signal PCLK1 is generated by detecting the rising edge of the second external clock signal CLK1.

The first internal clock signal PCLK0 generates the long-time delay signal PSFRG1 via the long-time delay 213. By detecting the rising edge of the long-time delay signal PSFRG1, the level of the auxiliary signal XAD0 is transitioned from "low" to "high".

The second internal clock signal PCLK1 generates the short-time delay signal PSFRG2 via the short-time delay 217. By detecting the rising edge of the short-time delay signal PSFRG2, the level of the preliminary signal XPRE1 is transitioned from "high" to "low".

At high frequency, the level transition of the auxiliary signal XAD0 occurs later than that of the preliminary signal XPRE1. Thus, by detecting the level transition of the auxiliary signal XAD0 from "low" to "high", the level of the control signal NDL0 is transitioned from "high" to "low", and the register 201 blocks the input of the output line data DIOB.

Figure 8:
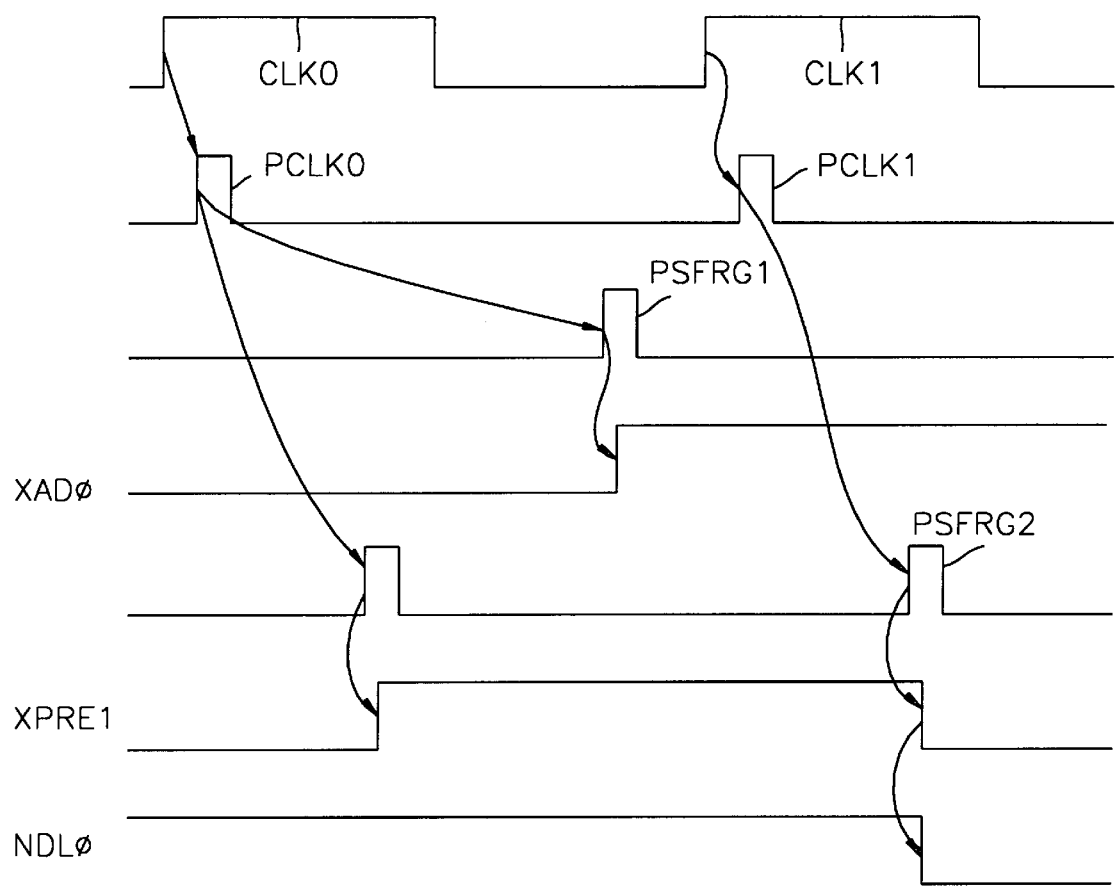
FIG. 8 is a timing diagram illustrating device operation at low frequency.

FIG. 8 is a timing diagram illustrating operation of the synchronous semiconductor memory device at low frequency. In the same manner as in the operation at high frequency, the level transition of the auxiliary signal XAD0 from "low" to "high" and the preliminary signal XPRE1 from "high" to "low" occurs.

However, at low frequency, the level transition of the preliminary signal XPRE1 occurs later than that of the auxiliary signal XAD0. Thus, by detecting the level transition of the preliminary signal XPRE1 from "high" to "low", the level of the control signal NDL0 is transitioned from "high" to "low", and the register 201 blocks the input of the output line data DIOB.

As shown in FIGS. 7 and 8, the register 201 blocks the input of the first output data by the first external clock signal CLK0 at a high frequency and by the second external clock signal CLK1 at a low frequency.

Thus, even if a memory has difficulty when operating at a high frequency, the memory can operate at a low frequency without any problems.

The present invention is not limited to the above embodiments, and further modifications and alterations within the scope of the invention will occur to those skilled in the art.

What is claimed is:

1. A synchronous semiconductor memory device in which data are continuously output during one cycle of a reading mode, comprising:

a control unit for generating a control signal in response to first and second external clock signals, wherein said control signal is transitioned in response to either an auxiliary signal which is transitioned by detecting the rising edge of the first external clock signal or a preliminary signal which is transitioned by detecting the rising edge of the second external clock signal, whichever changes state later; and a register for storing data output from a cell array in response to said control signal.

2. A synchronous semiconductor memory device of claim 1, wherein said control unit comprises:

an internal clock signal generator for generating a first internal clock signal by detecting the rising edge of the first external clock signal, and a second internal clock signal by detecting the rising edge of the second external clock signal;

an auxiliary signal delay and generator for delaying the first internal clock signal and generating an auxiliary signal which is transitioned in response to the activation of the first internal clock signal;

a preliminary signal delay and generator for delaying the second internal clock signal by a predetermined time which is shorter than the delay of said auxiliary signal delay and generator, and generating a preliminary signal which is transitioned in response to the activation of the second internal clock signal; and a control signal generator which receives the auxiliary signal and the preliminary signal and generates said control signal.

3. A synchronous semiconductor memory device of claim 2, wherein said auxiliary signal delay and generator comprises:

a long-time delay for delaying the first internal clock signal to generate a long-time delay clock signal; and an auxiliary signal generator for generating an auxiliary signal which is transitioned in response to the activation of the long-time delay clock signal.

4. A synchronous semiconductor memory device of claim 3, wherein said auxiliary signal generator comprises:

a first transmission latch gate for transmitting an auxiliary circulation signal and latching said transmitted auxiliary circulation signal when the long-time delay signal is inactive;

a second transmission latch gate for transmitting the output signal of the first transmission latch gate and latching the transmitted signal when the long-time delay signal is active, to generate said auxiliary signal; and a transmission gate for transmitting the output signal of the second transmission latch gate when the long-time delay signal is inactive, to generate said auxiliary circulation signal.

5. A synchronous semiconductor memory device of claim 4, wherein said auxiliary signal generator further comprises an initializing portion for initializing said auxiliary signal after a reading mode is completed.

6. A synchronous semiconductor memory device of claim 2, wherein said preliminary signal delay and generator comprises:

a short-time delay for delaying said second internal clock signal to generate a short-time delay clock signal; and a preliminary signal generator for generating said preliminary signal which is transitioned in response to the activation of the short-time delay clock signal.

7. A synchronous semiconductor memory device of claim 6, wherein said preliminary signal generator comprises:

a first transmission latch gate for transmitting a preliminary circulation signal and latching the transmitted preliminary circulation signal when the short-time delay signal is inactive;

a second transmission latch gate for transmitting the output signal of the first transmission latch gate and latching the transmitted signal when the short-time delay signal is active, to generate said preliminary signal; and a transmission gate for transmitting the output signal of the second transmission latch gate when the short-time delay signal is inactive, to generate said preliminary circulation signal.

8. A synchronous semiconductor memory device of claim 7, wherein said preliminary signal generator further comprises an initializing portion for initializing said preliminary signal after a reading mode is completed.

9. A synchronous semiconductor memory device of claim 2, wherein said control signal generator comprises:

a transmission gate for transmitting said preliminary signal by detecting the rising edge of the first external clock signal, in response to said auxiliary signal; and a buffer for storing said signal transmitted by said transmission gate to generate a control signal.

10. A synchronous semiconductor memory device of claim 9, wherein said control signal generator further comprises an initializing portion for initializing said control signal when said auxiliary signal is inactive.

11. A synchronous semiconductor memory device of claim 1, wherein said register comprises:
   a transmission latch gate for transmitting the output line data when said control signal is active; and
   a latch for storing said signal transmitted by said transmission gate.

12. A synchronous semiconductor memory device of claim 11, wherein said register further comprises an initializing portion for initializing the output signal of said transmission gate when the power is turned on.

13. A method of outputting data from a synchronous semiconductor memory device, wherein data is continuously output during one cycle of a reading mode, said method comprising the steps of:
   (a) generating a control signal in response to first and second external clock signals;
   (b) storing data output from a cell array in response to said control signal; and
   (c) transitioning said control signal in response to either an auxiliary signal which is transitioned by detecting the rising edge of the first external clock signal or a preliminary signal which is transitioned by detecting the rising edge of the second external clock signal, whichever changes later.

14. A data output method of claim 13, wherein said step (a) of generating the control signal comprises the sub-steps of:
   (a1) generating a first internal clock signal by detecting the rising edge of the first external clock signal and a second internal clock signal by detecting the rising edge of the second external clock signal;
   (a2) delaying the first internal clock signal and generating the auxiliary signal which is transitioned in response to the activation of the first internal clock signal;
   (a3) delaying the second internal clock signal by a predetermined time which is shorter than the delay of step (a2) and generating the preliminary signal which is transitioned in response to the activation of the second internal clock signal; and
   (a4) generating the control signal which is transitioned in response to either the auxiliary signal or the preliminary signal, whichever changes later, by receiving the auxiliary signal and the preliminary signal.

15. A data output method of claim 14, wherein the step (a2) comprises the sub-steps of:
   (a2-1) delaying the first internal clock signal to generate a long-time delay clock signal; and
   (a2-2) generating the auxiliary signal which is transitioned in response to the activation of the long-time delay clock signal.

16. A data output method of claim 14, wherein the step (a3) comprises the sub-steps of:
   (a3-1) delaying the second internal clock signal to generate a short-time delay clock signal; and
   (a3-2) generating the preliminary signal which is transitioned in response to the activation of the short-time delay clock signal.

* * * * *